(12) United States Patent
Kim et al.

(10) Patent No.: US 9,064,812 B2
(45) Date of Patent: Jun. 23, 2015

(54) ASPECT RATIO DEPENDENT ETCH (ARDE) LAG REDUCTION PROCESS BY SELECTIVE OXIDATION WITH INERT GAS SPUTTERING

(71) Applicant: APPLIED MATERIALS, INC., Santa Clara, CA (US)

(72) Inventors: Jinsu Kim, Kyung-Ki-Do (KR); Xiaosong Ji, Milpitas, CA (US); Jinhan Choi, San Ramon, CA (US); Ho Jeong Kim, San Jose, CA (US); Byungkook Kong, San Ramon, CA (US); Hoon Sang Lee, Hwasung (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/072,430

(22) Filed: Nov. 5, 2013

(65) Prior Publication Data

US 2015/0064919 A1    Mar. 5, 2015

Related U.S. Application Data

(60) Provisional application No. 61/874,033, filed on Sep. 5, 2013.

(51) Int. Cl.
*H01L 21/302* (2006.01)
*H01L 21/3065* (2006.01)

(52) U.S. Cl.
CPC .................................. *H01L 21/3065* (2013.01)

(58) Field of Classification Search
USPC ......... 438/400, 431, 700, 706, 712, 714, 717, 438/723; 216/37, 45, 67
See application file for complete search history.

(56) References Cited

U.S. PATENT DOCUMENTS

| | | | | |
|---|---|---|---|---|
| 5,468,342 | A * | 11/1995 | Nulty et al. | 438/714 |
| 6,743,727 | B2 * | 6/2004 | Mathad et al. | 438/695 |
| 7,033,954 | B2 * | 4/2006 | Donohoe | 438/723 |
| 8,133,817 | B2 | 3/2012 | Sasano et al. | |
| 2011/0177669 | A1 | 7/2011 | Lee et al. | |

OTHER PUBLICATIONS

Rangelow et al. Journal of Vacuum Science & Technology, vol. B 13(6), Nov./Dec. 1995 pp. 2394 to pp. 2399.*

* cited by examiner

*Primary Examiner* — Lan Vinh
*Assistant Examiner* — Maki Angadi
(74) *Attorney, Agent, or Firm* — Moser Taboada; Alan Taboada

(57) ABSTRACT

Embodiments of methods for etching a substrate include exposing the substrate to a first plasma formed from an inert gas; exposing the substrate to a second plasma formed from an oxygen-containing gas to form an oxide layer on a bottom and sides of a low aspect ratio feature and a high aspect ratio feature, wherein the oxide layer on the bottom of the low aspect ratio feature is thicker than on the bottom of the high aspect ratio feature; etching the oxide layer from the bottom of the low and high aspect ratio features with a third plasma to expose the bottom of the high aspect ratio feature while the bottom of the low aspect ratio feature remains covered; and exposing the substrate to a fourth plasma formed from a halogen-containing gas to etch the bottom of the low aspect ratio feature and the high aspect ratio feature.

20 Claims, 4 Drawing Sheets

ASPECT RATIO DEPENDENT ETCH (ARDE) LAG REDUCTION PROCESS BY SELECTIVE OXIDATION WITH INERT GAS SPUTTERING

CROSS-REFERENCE TO RELATED APPLICATIONS

This application claims benefit of U.S. provisional patent application Ser. No. 61/874,033, filed Sep. 5, 2013, which is herein incorporated by reference.

FIELD

Embodiments of the present invention generally relate to etching high aspect ratio features and low aspect ratio features on a substrate.

BACKGROUND

In electronic device fabrication, substrates often have shallow trench isolation (STI) structures used, for example, to isolate different devices formed on the semiconductor wafer. The STI structures may have different aspect ratios of depth of the feature to the width of the structure. One challenge of fabricating, or etching, shallow trench isolation (STI) structures in a substrate is a difference in etch rate, referred to as micro-loading, between high aspect ratio structures and low aspect ratio structures. Micro-loading manifests itself as differences in feature profile and etch depth between high aspect ratio features and low aspect ratio features on a substrate in which the features are being etched. For example, in some processes, low aspect ratio features may be etched at a faster rate, and thus to a greater depth than an etch depth corresponding to the high aspect ratio features, a process known as aspect ratio dependent etching (ARDE). Controlling micro-loading is important, as certain applications (such as NAND flash) require high microloading, while other applications (such as DRAM) require low to minimal micro-loading.

Accordingly, the inventors have provided improved methods of etching a substrate having high aspect ratio features and low aspect ratio features while reducing aspect ratio dependent etching.

SUMMARY

Embodiments of methods for etching high aspect ratio features and low aspect ratio features on a substrate. In some embodiments, a method of processing a substrate having a low aspect ratio feature and a high aspect ratio feature disposed in the substrate includes (a) exposing the substrate to a first plasma formed from an inert gas; (b) subsequently exposing the substrate to a second plasma formed from a first process gas comprising an oxygen-containing gas to form an oxide layer on a bottom and sides of the low aspect ratio feature and on a bottom and sides of the high aspect ratio feature, wherein the oxide layer formed on the bottom of the low aspect ratio feature is thicker than the oxide layer formed on the bottom of the high aspect ratio feature; (c) etching the oxide layer from the bottom of the low aspect ratio feature and from the bottom of the high aspect ratio feature with a third plasma formed from a second process gas to expose the bottom of the high aspect ratio feature while the bottom of the low aspect ratio feature remains covered by the oxide layer; and (d) exposing the substrate to a fourth plasma formed from a third process gas comprising a halogen-containing gas to etch the bottom of the low aspect ratio feature and the bottom of the high aspect ratio feature.

Other and further embodiments of the present invention are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
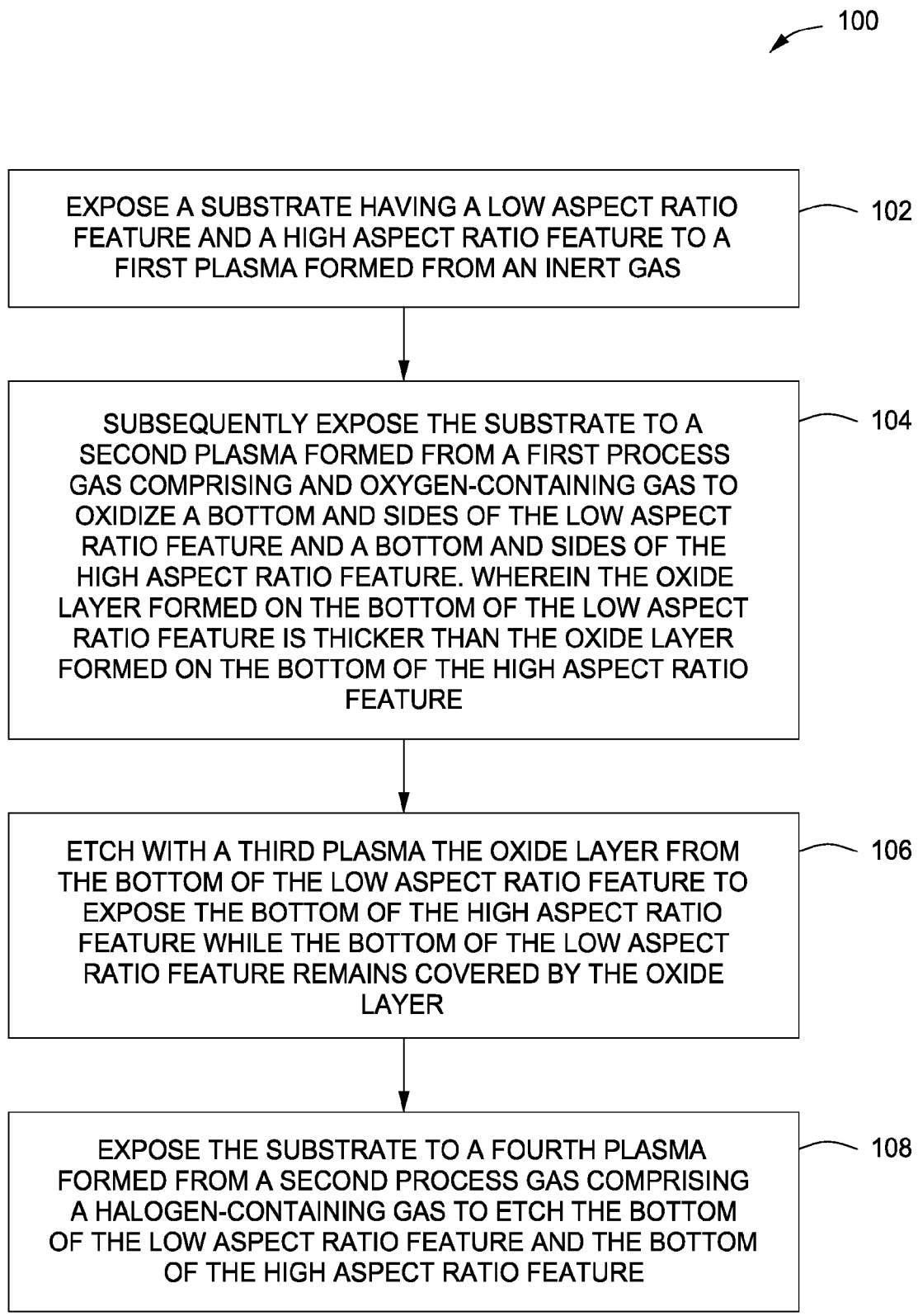
FIG. 1 is a flow diagram of a method for etching a shallow trench isolation structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for fabricating shallow trench isolation (STI) structures that may advantageously provide improved control over etch depth microloading and reduce aspect ratio dependent etching (ARDE) lag.

FIG. 1 is a flow diagram of a method 100 for etching a shallow trench isolation structure in accordance with some embodiments of the present invention. The method of FIG. 1 is described with reference to FIGS. 2A-2F where appropriate.

Figure 2A:
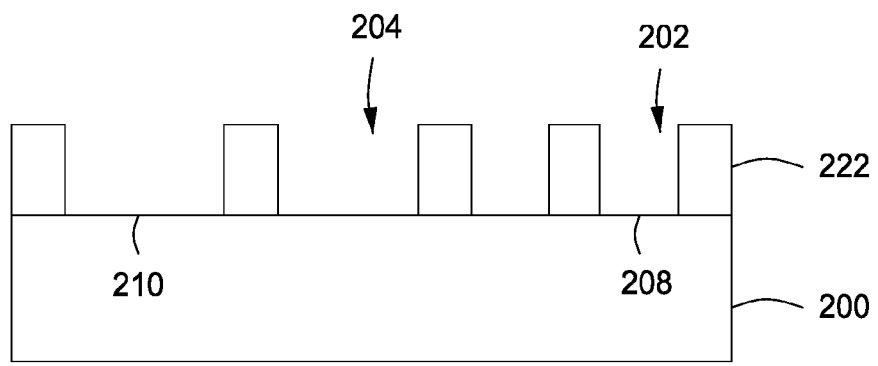
FIGS. 2A-2F depict the stages of fabrication of etching a shallow trench isolation structure in accordance with some embodiments of the present invention.

The method 100 may be performed on a substrate 200 having low aspect ratio features the be etched and high aspect ratio features to be etched disposed in the substrate 200, as shown in FIG. 2A. The substrate 200 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer.

In some embodiments, and as depicted in FIG. 2A, a mask layer 222 may be formed and patterned atop the substrate 200 to define the regions where the STI features are to be etched. The STI features may be high aspect ratio features 202 and low aspect ratio features 204. In some embodiments, the high aspect ratio features 202 have a depth to width ratio of up to about 30:1. For example, in some embodiments, the high aspect ratio features 202 have a depth to width ratio of about 10:1 to about 40:1. In some embodiments, the low aspect ratio features 204 have a depth to width ratio of up to about 15:1. For example, in some embodiments, the low aspect ratio features 204 have a depth to width ratio of about 3:1 to about 10:1.

The patterned mask layer 222 may be any suitable mask layer such as a hard mask or photoresist layer. For example, in embodiments where the patterned mask layer 222 is a hard mask, the patterned mask layer 222 may comprise at least one of oxides, such as silicon dioxide ($SiO_2$), silicon oxynitride (SiON), or the like, or nitrides, such as titanium nitride (TiN), silicon nitride (SiN), or the like, silicides, such as titanium silicide (TiSi), nickel silicide (NiSi) or the like, or silicates, such as aluminum silicate (AlSiO), zirconium silicate (ZrSiO), hafnium silicate (HfSiO), or the like. Alternatively, or in combination, in some embodiments, the patterned mask layer 222 may comprise an amorphous carbon, such as Advanced Patterning Film (APF), available from Applied Materials, Inc., located in Santa Clara, Calif., or a tri-layer resist (e.g., a photoresist layer, a Si-rich anti-reflective coating (ARC) layer, and a carbon-rich ARC, or bottom ARC (BARC) layer), a spin-on hardmask (SOH), or the like. The patterned mask layer 222 may be formed by any process suitable to form a patterned mask layer 222 capable of providing an adequate template for defining STI structures. For example, in some embodiments, the patterned mask layer 222 may be formed via a patterned etch process. In some embodiments, for example where the patterned mask layer 222 will be utilized to define advanced or very small node devices (e.g., about 40 nm or smaller nodes, such as Flash memory devices), the patterned mask layer 222 may be formed via a spacer mask patterning technique, such as a self-aligned double patterning process (SADP). In some embodiments, the patterned mask layer 222 may define one or more areas of high feature density and one or more areas of low feature density.

Optionally, one or more layers (not shown) may be provided between the substrate 102 and the mask layer 122. For example, intervening layers may be provided as desired for varying applications such as NAND flash, MRAM, or the like. In some embodiments, the layer may comprise polysilicon and/or a tunnel oxide layer.

Figure 2B:
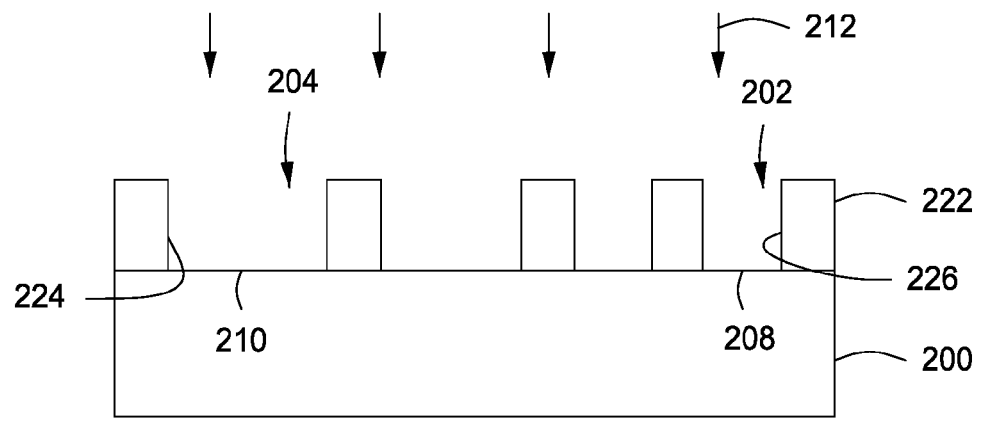

As depicted in FIG. 2B, the method 100 begins at 102 where a substrate 200 having a patterned mask layer 222 disposed thereon is exposed to a first plasma 212 formed from an inert gas. In some embodiments, the inert gas is one of argon, helium, xenon, or the like, or a combination thereof. The inventors have observed that a greater amount of inert gas particles from the first plasma 212 reach the bottom 210 of the low aspect ratio feature 204 as compared to the high aspect ratio feature 202, resulting in a greater amount of silicon lattice damage at the bottom 210 of the low aspect ratio feature 204 than at the bottom 208 of the high aspect ratio feature 202. As described below with respect to 104, this facilitates developing an enhanced passivation on the bottom 210 of the low aspect ratio feature 204 as compared to the bottom 208 of the high aspect ratio feature 202.

In some embodiments, the first plasma 212 may be formed by coupling RF power at a suitable frequency to the inert gas within a suitable process chamber, such as described below with respect to FIG. 3, under suitable conditions to establish and maintain the plasma. For example, in some embodiments, about 500 watts to about 2000 watts of RF energy at a frequency in a range from about 50 kHz to 13.56 MHz may be provided to an inductively coupled antenna of the process chamber to ignite and maintain the plasma. In some embodiments, about 20 watts to about 300 watts of a bias power may be provided, for example, an RF bias power at a frequency of about 13.56 MHz to the substrate via a substrate support. In some embodiments, the process chamber may be maintained at a pressure of less than about 100 mTorr. For example, in some embodiments, the process chamber may be maintained at a pressure of about 5 mTorr to about 100 mTorr. In some embodiments, the process chamber may be maintained at a temperature of about 10 degrees Celsius to about 120 degrees Celsius. In some embodiments, the inert gas may be provided to the process chamber at any suitable flow rate to form the first plasma 212. For example, in some embodiments, the inert gas may be provided at a flow rate of about 50 sccm to about 1000 sccm.

Figure 2C:
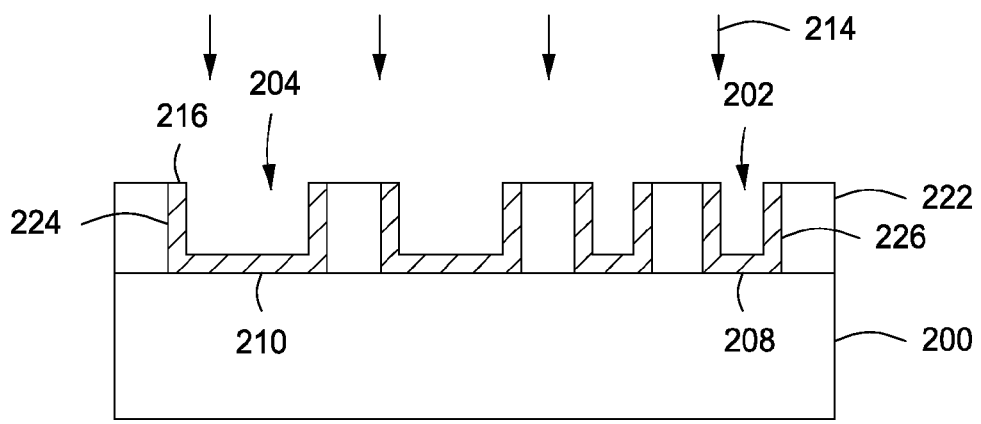

Next at 104, and as depicted in FIG. 2C, the substrate 200 is exposed to a second plasma 214 to oxidize a bottom 210 and sides 224 of the low aspect ratio feature 204 and a bottom 208 and sides 226 of the high aspect ratio feature 202. In some embodiments, the second plasma 214 is formed from a first process gas comprising an oxygen-containing gas suitable for oxidizing the surface of a substrate 200, as described above. In some embodiments, the oxygen-containing gas can be for example, a gas that contains oxygen or oxygen and other essentially non-reactive elements, such as nitrogen, or the like. For example, in some embodiments, the oxygen containing gas may be, for example, one or more of oxygen gas ($O_2$), ozone ($O_3$), nitrous oxide ($N_2O$), or the like. In some embodiments, the first process gas further comprises an inert gas such as argon, helium, or the like.

As described above, the increased silicon lattice damage at the bottom 210 of the low aspect ratio feature 204 as compared to the bottom 208 of the high aspect ratio feature 202 results in an oxide layer 216 formed on the bottom 210 of the low aspect ratio feature 204 that is thicker than the oxide layer 216 formed on the bottom 208 of the high aspect ratio feature 202. In some embodiments, the difference between the thickness of the oxide layer 216 formed atop the bottom 208 of the high aspect ratio feature 202 and the thickness of the oxide layer 216 formed atop the bottom 210 of the low aspect ratio feature 204 is less than about 10 nm. For example, in some embodiments, the thickness of the oxide layer 216 formed atop the bottom 208 of the high aspect ratio feature 202 is about 3 nm and the thickness of the oxide layer 216 formed atop the bottom 210 of the low aspect ratio feature 204 is about 5 nm to about 7 nm. As explained below, the thicker oxide layer 216 at the bottom 210 of the low aspect ratio feature 204 compensates for the faster etch rate of the low aspect ratio feature 204, allowing the etch depth of the low aspect ratio feature 204 to more closely match the etch depth of the high aspect ratio feature 202. In some embodiments, the second plasma 214 may be formed in the same type of process chamber and under the same conditions as described above for the first plasma 212.

Figure 2D:
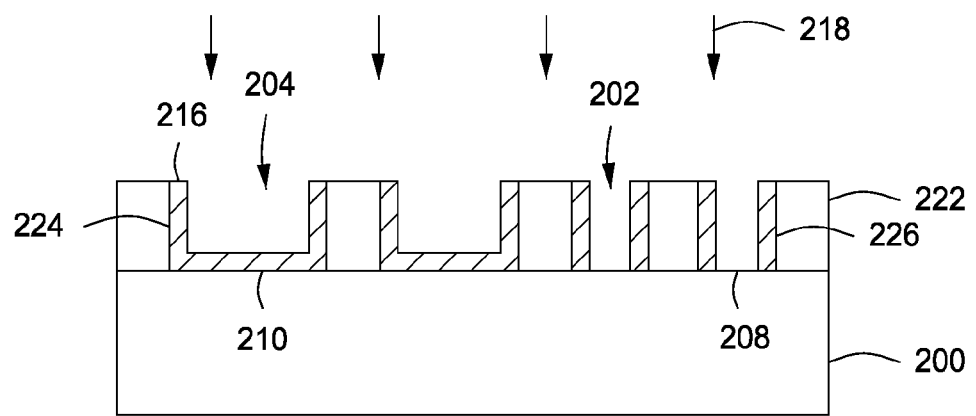

Next at 106, and as depicted in FIG. 2D, the oxide layer 216 from the bottom 210 and side 224 of the low aspect ratio feature 204 and the oxide layer 216 from the bottom 208 and side 226 of the high aspect ratio feature 202 is etched with a third plasma 218 to expose the bottom 208 of the high aspect ratio feature 202 while the bottom 210 of the low aspect ratio feature 204 remains covered by the oxide layer 216. The third plasma 218 is formed from any suitable process gas used to etch an oxide layer with appropriate selectivity against surrounding layers that are not to be etched. For example, in some embodiments, a second process gas may comprise a halogen-containing gas. For example, in some embodiments, the third plasma 218 is formed from a second process gas comprising a fluorine containing gas, for example one or more of tetrafluoromethane ($CF_4$), hexafluoroethane ($C_2F_6$), fluoromethane ($CH_3F$), difluoromethane ($CH_2F_2$), methyl trifluoride ($CHF_3$), hexafluorobutadiene ($C_4F_6$), and octafluorocyclobutane ($C_4F_8$). In some embodiments, the second process gas further comprises an inert gas such as argon, helium, or the like. In some embodiments, the third plasma 218 may be formed in the same type of process chamber and under the same pressure, temperature, and gas flow rate conditions as described above for the first plasma 212. In some embodiments, the third plasma 218 may be formed by coupling RF power at a suitable frequency to the second process gas within a suitable process chamber, such as described below with respect to FIG. 3, under suitable conditions to establish and maintain the plasma. For example, in some embodiments, about 100 watts to about 1000 watts of RF energy at a frequency in a range from about 50 kHz to 13.56 MHz may be provided to an inductively coupled antenna of the process chamber to ignite and maintain the plasma. In some embodiments, about 20 watts to about 500 watts of a bias power may be provided, for example, an RF bias power at a frequency of about 13.56 MHz to the substrate via a substrate support.

Figure 2E:
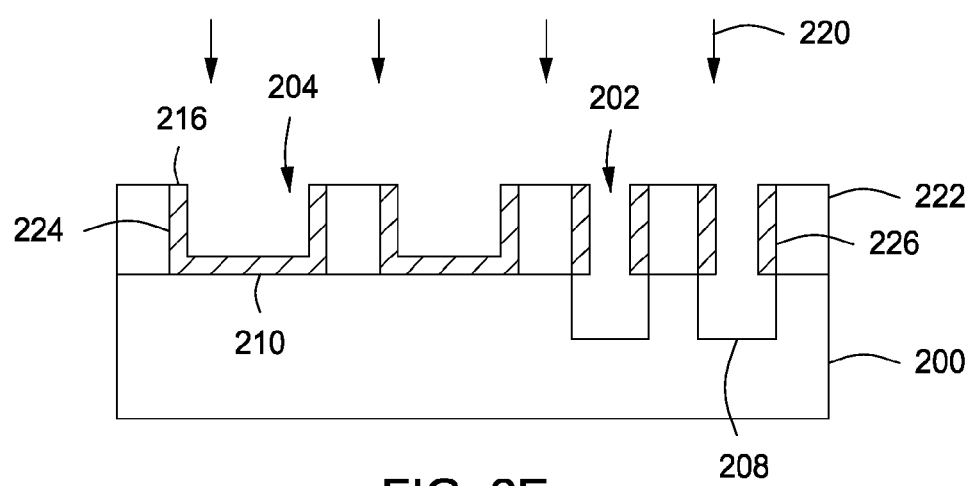

Next at 108, and as depicted in FIG. 2E, the substrate 200 is exposed to a fourth plasma 220 to etch the exposed bottom 208 and sides 226 of the high aspect ratio feature 202 and the remaining oxide layer 216 on the bottom 210 and sides 224 of the low aspect ratio feature 204. In some embodiments, the fourth plasma 220 is formed from a third process gas comprising a halogen-containing gas. For example in some embodiments, the fourth plasma 220 can be formed from a third process gas comprising one or more chlorine containing gases, such as one or more of chlorine ($Cl_2$), chlorine trifluoride ($ClF_3$), hydrogen bromide (HBr), boron trichloride ($BCl_3$), or the like. In some embodiments, the third process gas further comprises an inert gas such as argon, helium, or the like.

In some embodiments, the fourth plasma 220 may be formed by coupling RF power at a suitable frequency to the third process gas within a suitable process chamber, such as described below with respect to FIG. 3, under suitable conditions to establish and maintain the plasma. For example, in some embodiments, about 300 watts to about 2000 watts of RF energy at a frequency in a range from about 50 kHz to 13.56 MHz may be provided to an inductively coupled antenna of the process chamber to ignite and maintain the plasma. In some embodiments, about 300 watts to about 1200 watts of a bias power may be provided, for example, an RF bias power at a frequency of about 13.56 MHz to the substrate via a substrate support. In some embodiments, the process chamber may be maintained at a pressure of about 3 mTorr to about 100 mTorr. In some embodiments, the process chamber may be maintained at a temperature of about 10 degrees Celsius to about 120 degrees Celsius. In some embodiments, the third process gas may be provided to the process chamber at any suitable flow rate to form the fourth plasma 220. For example, in some embodiments, the third process gas may be provided at a flow rate of about 50 sccm to about 1500 sccm.

Figure 2F:
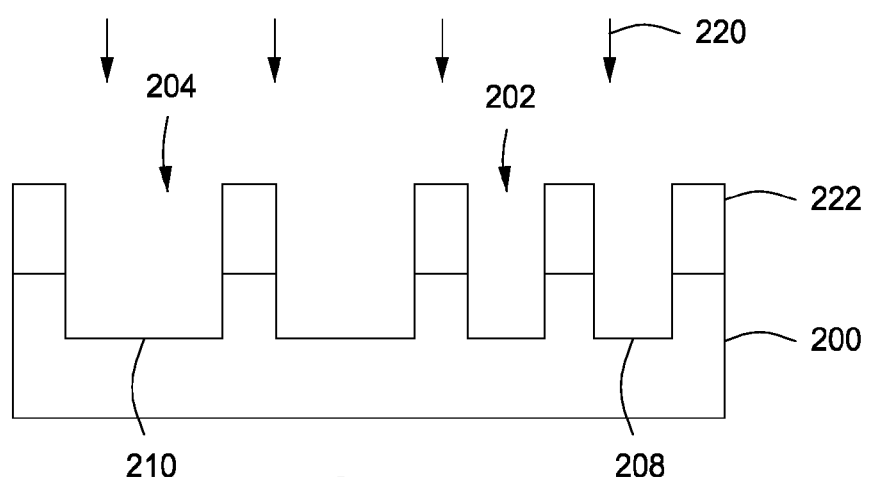

As explained above, the low aspect ratio feature 204 is etched at a faster rate than the high aspect ratio feature 202. However, the presence of the oxide layer 216 on the bottom 210 of the low aspect ratio feature 204 selectively enhances etching in the high aspect ratio feature 202. As depicted in FIG. 2F, this allows each of the low aspect ratio feature 204 and the high aspect ratio feature 202 to be etched to a substantially equivalent depth. In some embodiments, steps 102-108 can be repeated until a desired depth of the low aspect ratio feature 204 and the high aspect ratio feature 202 is reached.

In some embodiments, once the desired depth is reached the method 100 generally ends and the substrate 200 may continue to be processes as desired. For example, the low aspect ratio feature 204 and the high aspect ratio feature 202 may be filled with an appropriate material, such as silicon oxide, to form one or more STI structures. In some embodiments, a chemical-mechanical planarization process may be performed to smooth the surface of the substrate 200.

The processes described herein may be performed in an integrated etch processing system (e.g., a cluster tool) that includes a vacuum transfer chamber having processing chambers coupled thereto that are suitable for etching materials present in the substrate, such as silicon and, optionally, metal, polysilicon, and high-k material layers present in, for example, a gate film stack. The process described herein may also be performed in other integrated etch processing systems.

Figure 3:
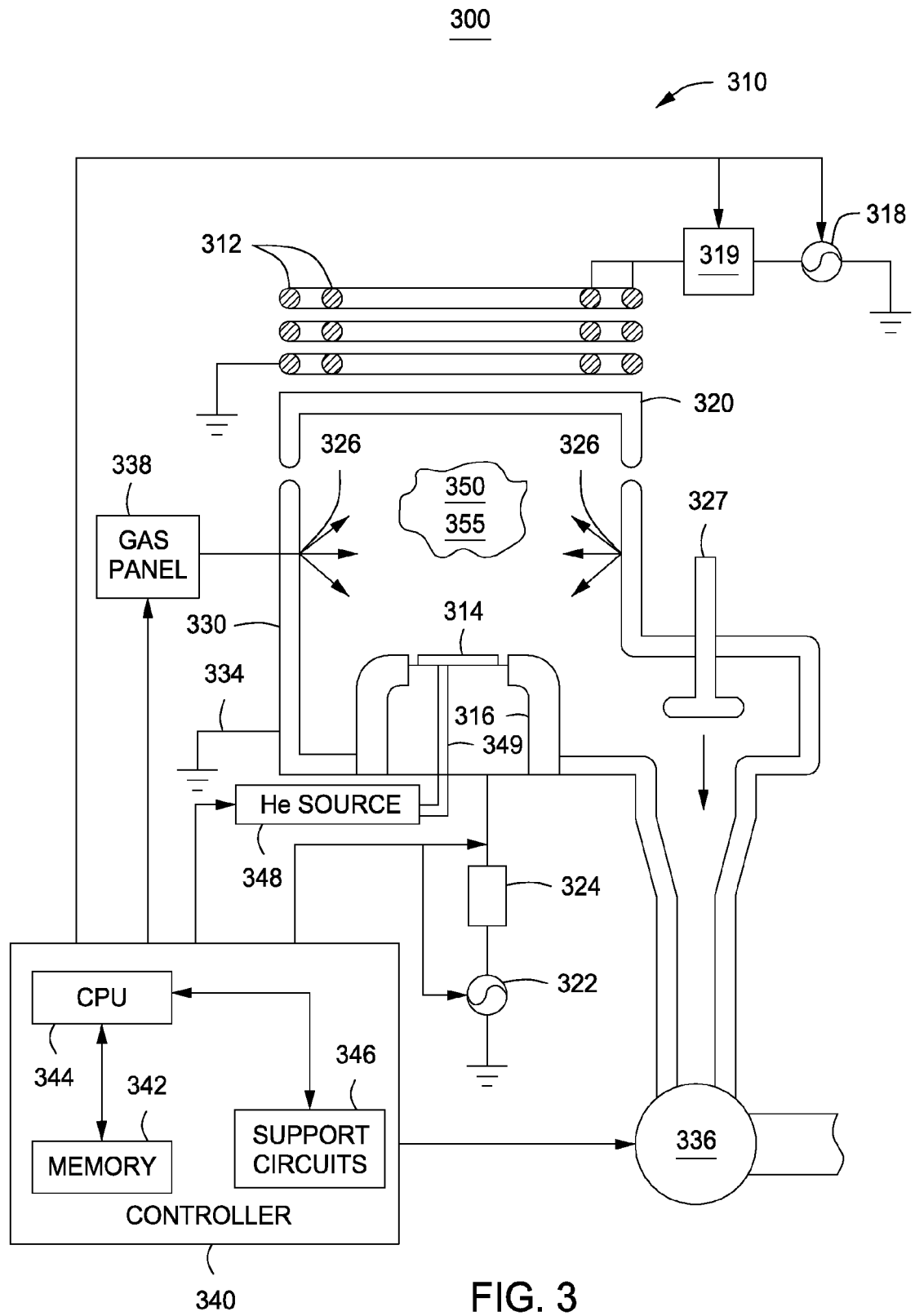
FIG. 3 depicts an etch reactor suitable for performing portions of the present invention.

For example, FIG. 3 depicts a schematic diagram of an illustrative etch reactor 300 of the kind that may be used to practice embodiments of the invention as discussed herein. The etch reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 300 comprises a chamber 310 having a substrate support 316 within a conductive body (wall 330), and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown). The inductive coil element 312 is coupled to a plasma power source 318 through a first matching network 319. The plasma power source 318 typically is capable of producing up to 3000 W at a tunable frequency in a range from 50 kHz to 13.56 MHz.

The substrate support 316 is configured as a cathode and is coupled, through a second matching network 324, to a biasing power source 322. The biasing power source 322 generally is capable of producing up to 1500 W at a frequency of approximately 13.56 MHz. The biasing power may be either continuous or pulsed power. In other embodiments, the biasing power source 322 may be a DC or pulsed DC source.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a substrate 314, such as the substrate 200 described above, is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the cathode 316, respectively. The pressure within the interior of the chamber 310 is controlled using a throttle valve 327 and a vacuum pump 336. Typically, the wall 330 is coupled to an electrical ground 334. The temperature of the wall 330 is controlled using liquid-containing conduits (not shown) that run through the wall 330.

The temperature of the substrate 314 is controlled by stabilizing a temperature of the substrate support 316. In one embodiment, the helium gas from a gas source 348 is provided via a gas conduit 349 to channels (not shown) formed in the pedestal surface under the substrate 314. The helium gas is used to facilitate heat transfer between the substrate support 316 and the substrate 314. During processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between about 0-350 degrees Celsius.

Other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and sub-systems, and the like. The inventive method described herein is generally stored in the memory 342 as a software routine. The software routine may also be stored and/or executed by a second CPU (not shown) that is remotely located from the hardware being controlled by the CPU 344.

The invention may be practiced using other semiconductor substrate processing systems wherein the processing parameters may be adjusted to achieve acceptable characteristics by those skilled in the art by utilizing the teachings disclosed herein without departing from the spirit of the invention.

While the foregoing is directed to embodiments of the present invention, other and further embodiments of the invention may be devised without departing from the basic scope thereof.

The invention claimed is:

1. A method of etching a substrate having a low aspect ratio feature and a high aspect ratio feature disposed in the substrate, comprising:
   (a) exposing the substrate to a first plasma formed from an inert gas;
   (b) subsequently exposing the substrate to a second plasma formed from a first process gas comprising an oxygen-containing gas to form an oxide layer on a bottom and sides of the low aspect ratio feature and on a bottom and sides of the high aspect ratio feature, wherein the oxide layer formed on the bottom of the low aspect ratio feature is thicker than the oxide layer formed on the bottom of the high aspect ratio feature;
   (c) etching the oxide layer from the bottom of the low aspect ratio feature and from the bottom of the high aspect ratio feature with a third plasma formed from a second process gas to expose the bottom of the high aspect ratio feature while the bottom of the low aspect ratio feature remains covered by the oxide layer; and
   (d) exposing the substrate to a fourth plasma formed from a third process gas comprising a halogen-containing gas to etch the bottom of the low aspect ratio feature and the bottom of the high aspect ratio feature.

2. The method of claim 1, further comprising exposing the substrate to the fourth plasma to etch each of the low aspect ratio feature and the high aspect ratio feature to a substantially equivalent depth.

3. The method of claim 1, further comprising repeating (a)-(d) until a desired depth of the low aspect ratio feature and high aspect ratio feature is reached.

4. The method of claim 1, wherein an aspect ratio of a depth to width of the high aspect ratio feature is up to about 30:1.

5. The method of claim 1, wherein the aspect ratio of the low aspect ratio feature is up to about 15:1.

6. The method of claim 1, wherein the inert gas is one of argon, helium, or xenon.

7. The method of claim 1, further comprising providing about 500 watts to about 2000 watts of RF energy to form the first plasma.

8. The method of claim 7, further comprising providing an RF bias power of about 20 watts to about 300 watts to the substrate during (a).

9. The method of claim 8, further comprising maintaining a pressure of less than about 100 mTorr during (a).

10. The method of claim 1, wherein a temperature of the substrate during (b) is about 10 degrees Celsius to about 120 degrees Celsius.

11. The method of claim 1, wherein a difference between the thickness of the oxide layer formed atop the bottom of the high aspect ratio feature and the thickness of the oxide layer formed atop the bottom of the low aspect ratio feature is less than about 10 nm.

12. The method of claim 1, wherein the first process gas further comprises an inert gas.

13. The method of claim 1, further comprising providing about 300 watts to about 2000 watts of RF energy to form the fourth plasma.

14. The method of claim 13, further comprising providing an RF bias power of about 300 watts to about 1200 watts to the substrate during (d).

15. The method of claim 13, further comprising maintaining a pressure of about 3 mTorr to about 100 mTorr during (d).

16. The method of claim 1, wherein the first process gas comprises one or more of oxygen gas ($O_2$), ozone ($O_3$), or nitrous oxide ($N_2O$).

17. The method of claim 1, wherein the second process gas comprises a fluorine-containing gas.

18. The method of claim 17, wherein the second process gas comprises one or more of tetrafluoromethane ($CF_4$), hexafluoroethane ($C_2F_6$), fluoromethane ($CH_3F$), and difluoromethane ($CH_2F_2$).

19. The method of claim 1, wherein the third process gas comprises a chlorine-containing gas.

20. The method of claim 19, wherein the third process gas comprises one or more of chlorine ($Cl_2$), chlorine trifluoride ($ClF_3$), hydrogen bromide (HBr), and boron trichloride ($BCl_3$).

* * * * *